United States Patent [19]
Achard et al.

[11] Patent Number: 5,373,462
[45] Date of Patent: Dec. 13, 1994

[54] NON-VOLATILE STORAGE CELL OF THE METAL - FERROELECTRIC - SEMICONDUCTOR TYPE

[75] Inventors: Hervé Achard, Grenoble; Jean-Pierre Joly, St. Egreve, both of France

[73] Assignee: Commissariat a l'Energie Atomique, France

[21] Appl. No.: 17,750

[22] Filed: Feb. 16, 1993

[30] Foreign Application Priority Data
Feb. 27, 1992 [FR] France .................. 92-02304

[51] Int. Cl.[5] .............................................. G11C 11/22
[52] U.S. Cl. ...................................... 365/145; 257/295
[58] Field of Search .................. 365/117, 145; 257/295

[56] References Cited
U.S. PATENT DOCUMENTS

| 2,791,759 | 5/1957 | Brown | 365/145 |
|---|---|---|---|
| 3,832,700 | 8/1974 | Wu et al. | 365/145 |
| 4,888,630 | 12/1989 | Paterson | 365/185 |
| 5,198,994 | 3/1993 | Natori | 365/145 |

FOREIGN PATENT DOCUMENTS 2323228  4/1977  France .

OTHER PUBLICATIONS
"A Ferroelectric Field Effect Device" By:Heyman et al Proceedings of the IEEE, vol. 54, No. 6, pp. 842–848 Jun., 1966.

Primary Examiner—Joseph A. Popek
Attorney, Agent, or Firm—Hayes, Soloway, Hennessey, Grossman & Hage

[57] ABSTRACT

A process for producing an improved non-volatile storage cell of the metal-ferroelectric-semiconductor type is provided. The non-volatile storage cell has at least one metal-ferroelectric-semiconductor transistor formed in a semiconductor substrate and having a source (5), a drain (6), and a gate (4). The gate is insulated from the source and the drain by a ferroelectric layer (2). The transistor has at least one lateral programming electrode (BL) in contact with the ferroelectric layer and insulated from the gate. In a preferred embodiment the cell also has a dielectric layer (7) interposed between the ferroelectric layer and the substrate. Particular utility for the present invention is found in the area of static memory devices, although other utilities are contemplated.

2 Claims, 5 Drawing Sheets

FIG. 1A  *PRIOR ART*
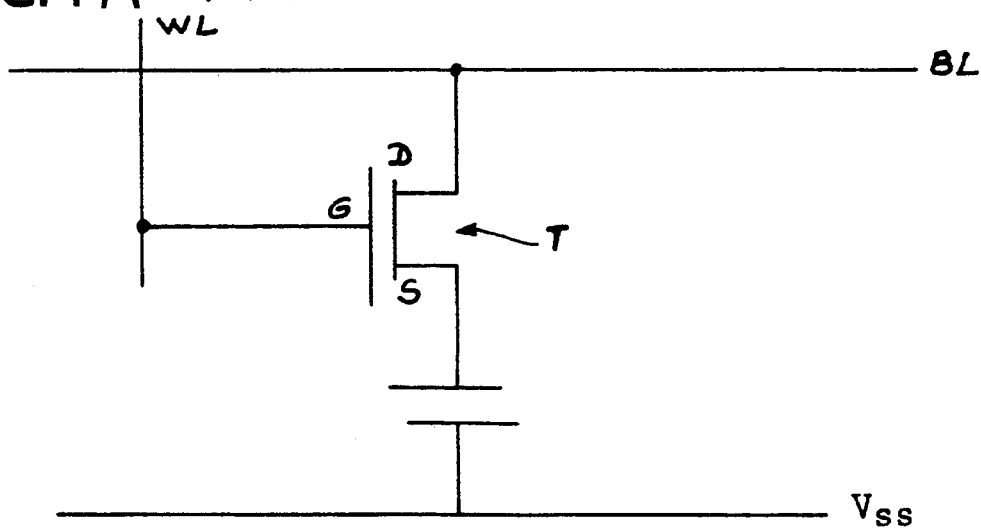
FIG. 1B  *PRIOR ART*
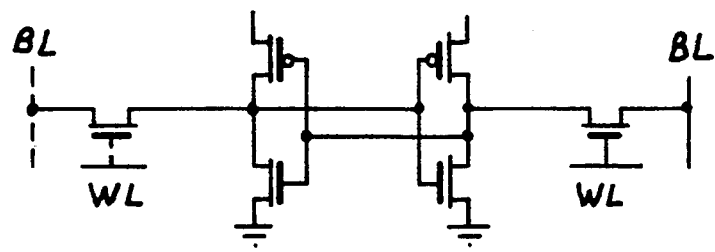
FIG. 1C  *PRIOR ART*
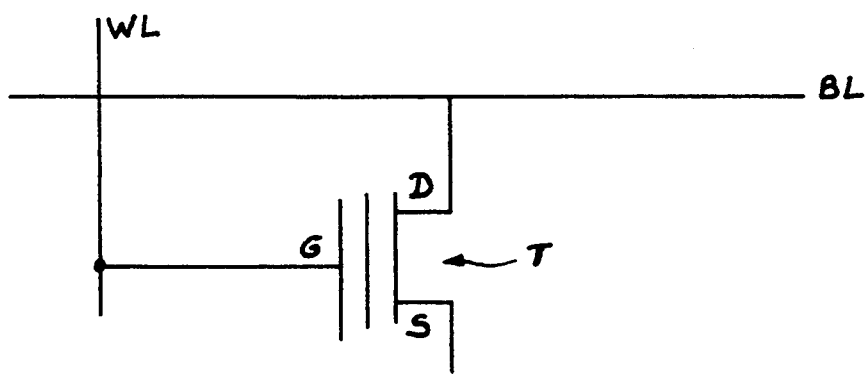

|  | BL | WL | SOURCE |
|---|---|---|---|
| PROGRAMMING VOLTAGE | $+V_p$ | 0 | 0 ($V_{ss}$) |
| COERCIVE FIELD | 0 | $+V_p$ | 0 ($V_{ss}$) |
| READING VOLTAGE | $+V_L$ | ~0 | 0 ($V_{ss}$) |

FIG. 4

NON-VOLATILE STORAGE CELL OF THE METAL - FERROELECTRIC - SEMICONDUCTOR TYPE

BACKGROUND OF THE INVENTION

1. Field of the Invention

The invention relates to a non-volatile storage cell of the metal-ferroelectric-semiconductor type and to a memory have such storage cells.

2. Brief Description of Related Art

Existing semiconductor memories are subdivided into two categories as a function of whether or not the stored information disappears when the power supply of the memory is interrupted. These memories are given different names, so that there are volatile memories (also known as dynamic memories) and non-volatile memories (also known as static memories).

In many cases non-volatile memories are read-only memories or ROM's. In such memories the information is written once and for all and cannot be modified. Among the read-only memories there are also programmable read-only memories or PROM's, as well as electrically erasable programmable read-only memories or EEPROM's, for which it is possible to modify the information state, but this can only take place a limited number of times, the information modification taking a long time. Consequently such memories are generally used in applications such as the storage of system programs in computers. In all other applications use is made of dynamic or volatile memories.

The presently existing non-volatile semiconductor memories essentially use the principle of charge storage by the injection of carriers (electrons or holes) into a dielectric. These charges are stored either in a conductive electrode embedded in the dielectrics (floating electrodes, SAMOS/FLOTOX structures), or at an interface between two dielectrics (MIOS structure). Such non-volatile memories are described on pp. 496 to 506 of the second edition of the publication "Physics of semiconductor devices" published by S. H. SZE and also in the chapter entitled "VLSI Electrically Erasable Programmable Read-Only Memory", of VLSI Handbook written by S. K. LAY and V. K. DHAM and published by Academic Press in 1985.

The state of the stored charge determines the binary 0 or 1 state of the information stored in the individual memory point. The information, i.e. the charge, is then read by the field effect created in the underlying semiconductor. Making the semi-conductor surface zone inverting or accumulating makes a MOS-type device conductive or non-conductive and its gate electrode is placed above the zone where the charges are stored.

Thus, the principle of writing information into such memories requires the injection of carriers into a dielectric. However, no matter what the carrier injection mode, the charge accumulation process is slow. A writing or erase cycle takes approximately or even more than 10 microseconds. Moreover, the injection leads to irreversible damage within the dielectric, in the form of trapped charges which gradually shield the stored charge, so as to limit the number of cycles to below $10^6$ and this is in the best possible case. The second document referred to hereinbefore, i.e. VLSI Handbook, relatively accurately describes this injection of carriers into a dielectric.

Finally, existing low cost, high density EPROM's are not electrically erasable and flash EEPROM's can only be erased blockwise. In order to obviate a certain number of these disadvantages, a novel technology has been recently proposed which makes use of ferroelectric effects. It is based on the use of metal-ferroelectric-metal capacitors for storing the information. The document entitled "A new memory technology is about to hit the market", in Revue Electronics of 18.2.1988 describes this novel technology. In its simplest version, with a conventional transistor is associated a capacitor of the aforementioned type, in accordance with the electronic diagram of FIG. 2A showing a so-called FRAM cell.

The programming and reading of said FRAM cell takes place in identical manner to that of a DRAM cell, whose electrical diagram is shown in FIG. 1. For such cells, the bit line BL is polarized for writing a "1" and is not polarized for writing a "0", the transistor T being made conductive during the programming of the cell by the polarization of the write line WL.

It is pointed out that a ferroelectric material has the property of a polarization state which varies with the electric field applied according to a hysteresis cycle and as shown in FIG. 3D.

From it can be deduced the following properties. There is a residual polarization P inducing an image charge Q on the electrodes (Q=P) in the absence of an electric field. This residual polarization is dependent on the history of the charges previously applied, if a strong electric field has been applied and which exceeds a certain value referred to as a coercive field. The polarization is positive, whereas it is negative if the electric field is negative.

The charge displaced during a voltage step from 0 to $+V$ (or to $-V$) will depend on the state of the ferroelectric, provided that V exceeds the value of the coercive field. It is also possible to have a 0 image charge, although the field is not 0, namely by applying Gaussian distribution, i.e.

$$E = \frac{Q - P(E)}{\epsilon_o}$$

and then by making Q=0 in the case where E is such that $P(E) = -\epsilon_o E$.

In the most widespread memory version using a metal-ferroelectric-metal capacitor, the information is read by subjecting the capacitor to a voltage step, so that the coercive field is exceeded. As a function of the initial polarization state, the ferroelectric will or will not be switched into the opposite polarization state.

The charge quantity displaced will be greater in the case of switching. It will then be possible to read the state of the memory point as a result of a current amplification circuit on the bit line able to discriminate the charge read with respect to a predetermined threshold. At least if the switching has been noticed, it is necessary to restore the ferroelectric to its initial state by a new voltage step in the opposite direction.

The major disadvantage of this technology is linked with the fatigue effect of ferroelectric materials. The residual polarization gradually decreases after a varying number of switching operations. This critical number is typically approximately $10^9$ to $10^{11}$ switching cycles. It is consequently not possible to read and write such a memory point more than $10^9$ times. It is therefore important to note that such a memory has a longer life on writing than an EEPROM, which can only be read and programmed $10^6$ times.

Moreover, these memories are also much faster on writing. Thus, less than 100 nanoseconds are adequate for reversing the polarization direction. However, the life on reading is much shorter than in the case of an EEPROM. To simplify, it can be stated, by comparison with an EEPROM, that a memory produced according to this technology is an essentially programmable or write mostly memory.

To obviate this disadvantage, another variant of cells also using metal-ferroelectric-metal capacitors has been proposed. This is the so-called ferroelectric SRAM memory shown in FIG. 2B and described in the document referred to hereinbefore, namely Review Electronics, as well as in French patent application 4 809 225 filed on Feb. 7, 1987. Such a memory functions like a conventional SRAM with 6 or 4 transistors and as shown in FIG. 1B, without the switching of the ferroelectric capacitors during the read/write cycles. The latter are only subject to action in the case of an interruption to the power supply as a result of an automatic opening of transistors rendered conductive by said interruption. This concept unfortunately suffers from the major disadvantage of the high cost of the memory point, due to the number of transistors and semiconductor surface per memory point.

In addition, the simplest memory structure using a single transistor and a single capacitor per memory point (FRAM cell) requires a quasi-systematic switching. Apart from the life problem, it also suffers from the major disadvantage that it does not tolerate the often significant fluctuations of the charges displaced in the ferroelectric between individual cells or on the same cell during the aging thereof. Thus, taking account of these fluctuations it may become impossible to discriminate between individual polarization states by reading the displaced charge.

It is known from the article by Shu-Yan WU in IEEE Transactions on electron devices, 1974, p. 499 to use a metal-ferroelectric-semiconductor transistor for solving these problems. In this transistor, the ferroelectric replaces the conventional MOS dielectric shown in FIG. 2C, said cell functioning in a similar manner to that of an EEPROM (FIG. 1C).

The ferroelectric is uniformly polarized over its entire surface in a predetermined residual polarization state (state 0). In this state, the transistor, for a chosen reading gate voltage, is in a conductive state. The programming of the complementary state 1 takes place by applying appropriate voltages to the terminals of the ferroelectric by the gate G, the drain D and, if necessary, the substrate, by means of a supplementary substrate, so that at least locally there is a reversal of the residual polarization direction of the ferroelectric. Level with these locations in the semiconductor, as a result of the effect of the induced field, the charges will be repelled and the transistor will be made non-conductive for reading and gate voltage.

The programming voltage on the semiconductor side can either be applied to the transistor drain. There is then a reversal of the polarization solely in the vicinity of the drain, but this is sufficient to block the transistor. This is the simplest version because it is possible to have a point-by-point programming without supplementary contacting. Alternatively it can be applied to the substrate, whilst maintaining the source and drain zones at 0 voltage. There is then a reversal of the ferroelectric on the complete channel zone. However, this requires specific contacting for each transistor, if a point-by-point programming is desired.

The erasing of state 1 takes place by the reverse operation, i.e. by creating an electric field opposite to that created during programming and by reestablishing the initial residual polarization.

Such a memory has a very long life on reading, in the same way as EPROMS and EEPROMS, whilst also having considerably improved speed and life on programming compared with the latter.

However, this structure still suffers from a major shortcoming. The ferroelectric must be in intimate contact with the semiconductor. Thus, the relationship between the permittivity of the ferroelectric and the dielectrics able to form at the ferroelectric/semiconductor interface is such that the complete potential drop takes place in the dielectric, even if the thickness of the latter exceed 1/10 of the total thickness. However, a ferroelectric is not generally chemically stable with standard semiconductors and in particular with silicon. It will therefore react with the latter to form intermediate compounds or certain elements will diffuse on either side of the interface, thus destroying the characteristics of one or other of the materials.

It has also been demonstrated that for a certain number of ferroelectrics there is a charge injection from the semiconductor into the ferroelectric with the trapping of the charges in the latter. The height of the barrier between the semiconductor and the ferroelectric is often inadequate for limiting this injection. The trapped charges often shield the polarization and the field effect induced by the latter. It is therefore necessary to introduce a dielectric material with a very high barrier, but then there is once again the problem of the shielding of the programming field by the latter and the application of excessive programming voltages.

In addition, ferroelectric layers used alone have mediocre breakdown properties. Finally, the ferroelectric has an extremely high apparent dielectric constant, which leads to excessive gate capacitances and to a difficulty of optimizing the transistors.

SUMMARY OF THE INVENTION

The present invention makes it possible to solve these problems. Thus, it proposes a non-volatile storage cell with at least one metal-ferroelectric-semiconductor transistor having a source, a drain and a gate, said gate being insulated from the source and the drain by a ferroelectric layer. The storage cell according to the invention is characterized in that the transistor has a lateral programming electrode in contact with a vertical wall of the ferroelectric layer of the transistor and which is insulated from the gate.

Advantageously, said electrode is metallic.

Moreover, according to an embodiment, the programming electrode is an electrode independent of the source and drain electrodes.

According to another embodiment of the invention, the programming electrode is common to one of the source or drain electrodes.

Advantageously, said storage cell has a dielectric layer between the ferroelectric layer and the semiconductor layer, the ferroelectric layer being advantageously lead zirconate titanate ($Pb(ZrTi)O_3$).

The process for the production of said storage cell comprises producing the metal-ferroelectric-semiconductor transistor or transistors and depositing a conductive layer on the source or drain zones contacted with the side walls of the ferroelectric layer.

Advantageously, said production process consists of etching the conductive layer so as to obtain at least one conductive residue in contact with one of the vertical walls of the ferroelectric layer.

BRIEF DESCRIPTION OF THE DRAWINGS

The invention is described in greater detail hereinafter relative to non-limitative embodiments and the attached drawings, wherein show:

FIGS. 1A, 1B, 1C Already described, electric diagrams respectively of the DRAM cell, the SRAM cell and the EPROM cell (or floating gate EEPROM and FLASH).

FIG. 4 The programming diagram of a memory point.

DETAILED DESCRIPTION OF PREFERRED EMBODIMENTS

Figure 2A:
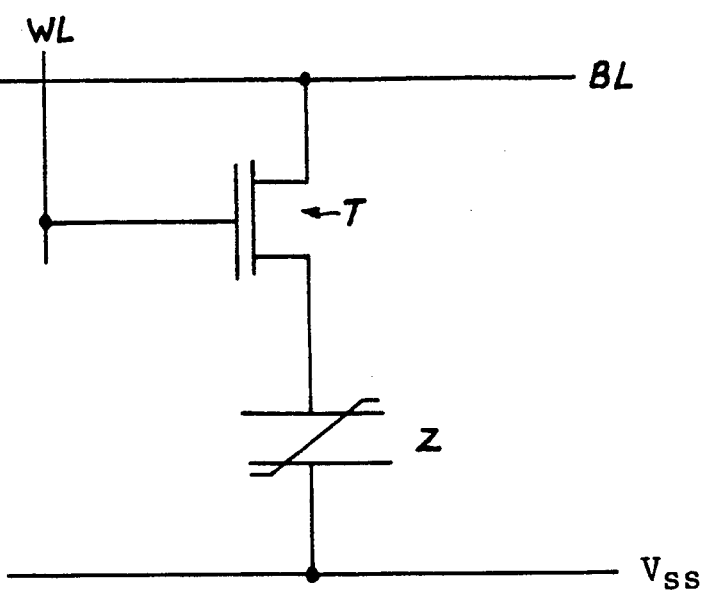
FIGS. 2A, 2B and 2C Already described, electronic diagrams respectively of the FRAM storage cell with one transistor, the FRAM storage cell based on a SRAM cell with six transistors and the storage cell with metal-ferroelectric-semiconductor transistors.
Figure 2B:
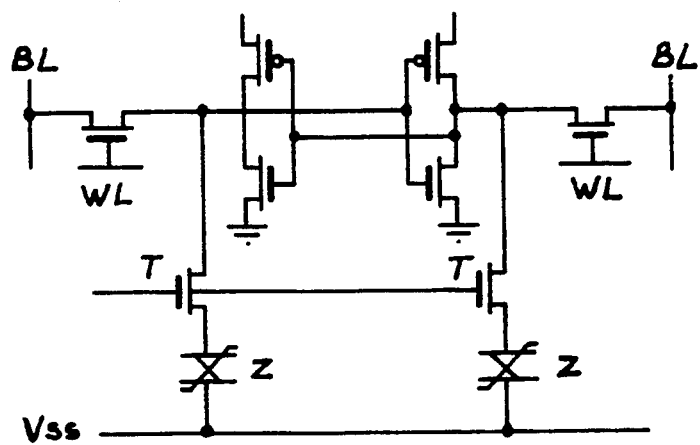
Figure 2C:
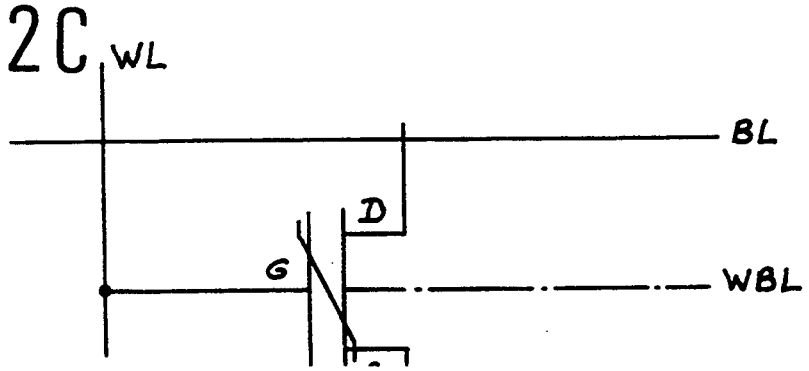
Figure 3A:
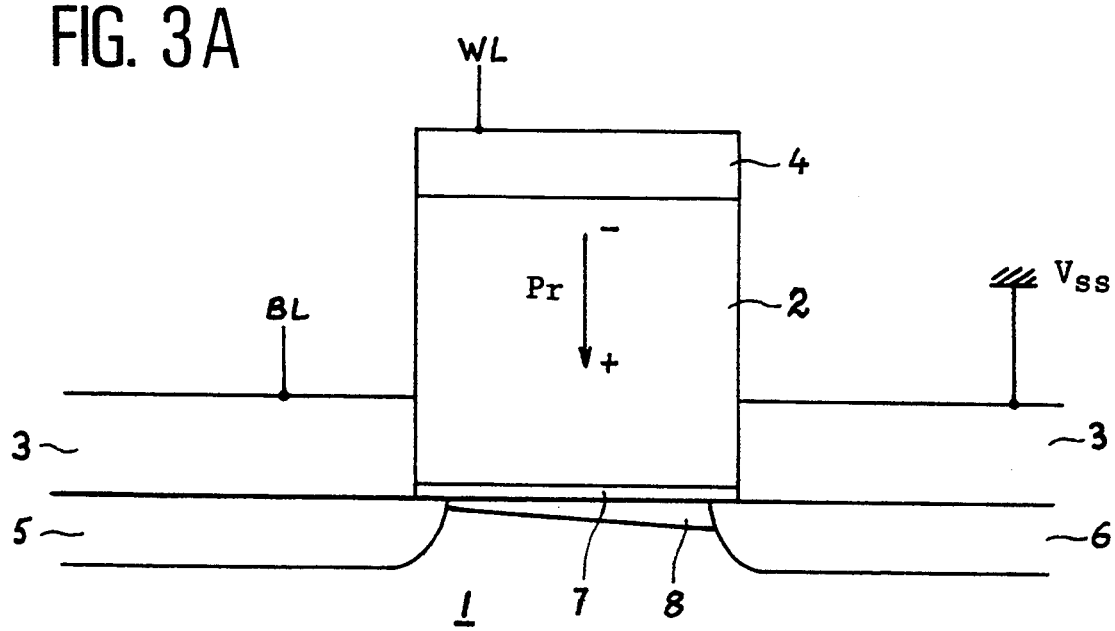
FIGS. 3A and 3B Diagrams of the storage cell transistor according to the invention, respectively in the unprogrammed state 0 and in a programmed stage 1.
Figure 3B:
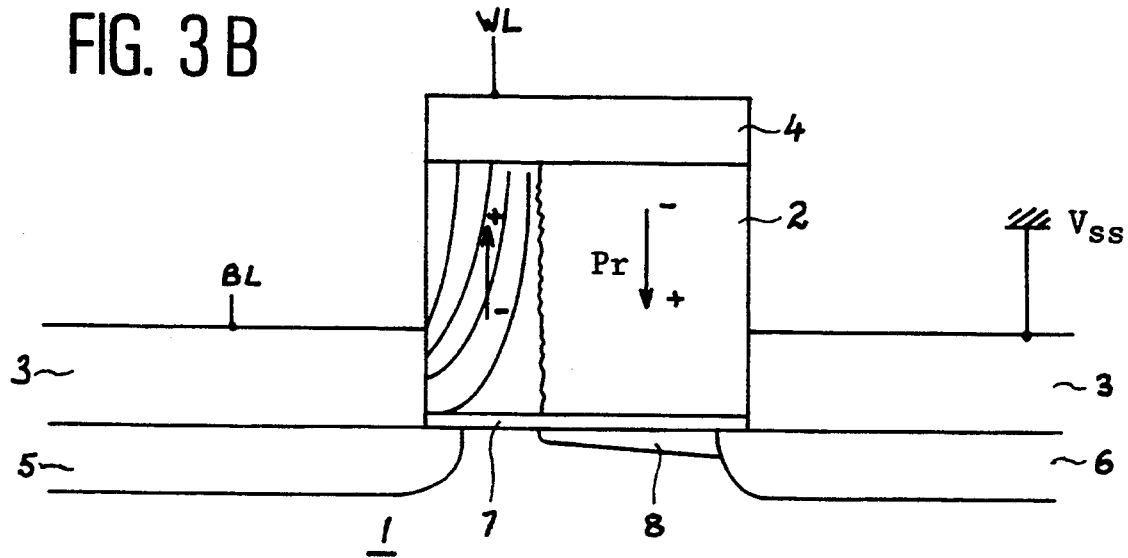

FIGS. 3A and 3B show the diagram of the transistor of the storage cell according to the invention. A memory point of the metal-ferroelectric-semiconductor type, like that of the invention, comprises a semiconductor substrate 1, a thin ferro-electric layer 2 and a conductive layer 3, placed on either side of the ferroelectric layer 2. The semiconductor substrate can be of the P type or the N type. In the device described, consideration is given to a P type semiconductor substrate 1. The conductive layer 3 is made from a degenerated semiconductor material or metal.

The memory point according to the invention also has a gate electrode 4, a source zone 5 and a drain zone 6. With the ferroelectric 2, the gate electrode 4 produces a gate pattern of the transistor. The conductive layer 3 is placed on either side of said gate pattern. It is therefore in direct contact with the ferroelectric 2 on the edge or flank thereof, which means that there is no intermediate material between the conductive layer 3 and the ferroelectric 2.

According to a preferred embodiment of the invention, the conductive layer 3 covers the source zone 5 and the drain zone 6 of the semiconductor 1, forming a single electrode therewith.

According to another embodiment of the invention, the conductive layer 3 can be insulated from the source zone 5 and the drain zone 6 and can form an independent electrode.

As in most conventional memories, the gate electrode 4 is connected to an addressing line, also known as a word line (WL). In the same way, the transistor source 5 is connected to a bit line (BL) and the transistor drain 6 is connected to earth or ground ($V_{ss}$). The bit line BL is both the bit writing line and the bit reading line.

Figure 3C:
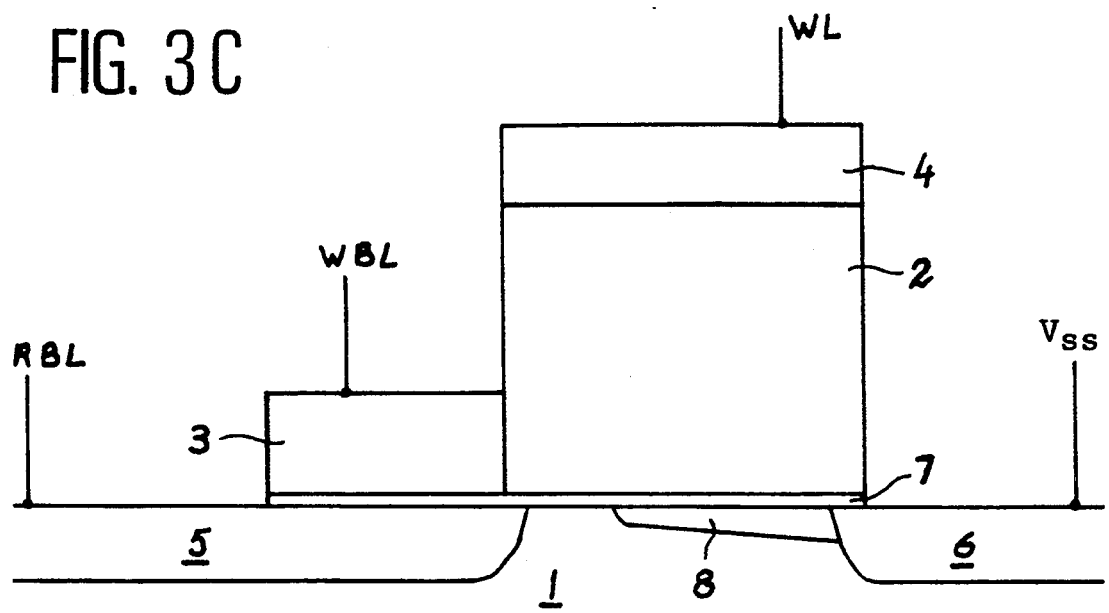
FIG. 3C The diagrams of the storage cell transistor according to an embodiment of the invention, in which the bit writing electrode is independent of the bit reading line.
Figure 3D:
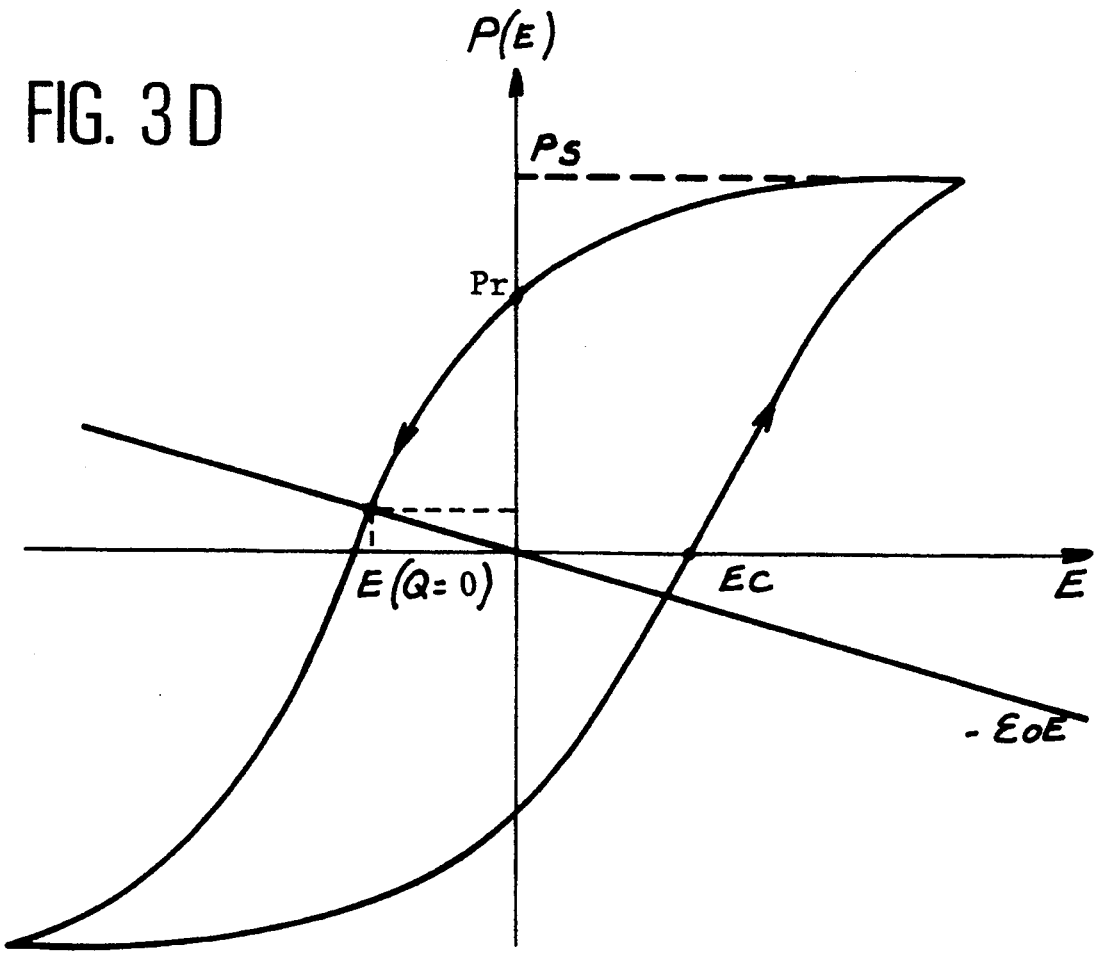
FIG. 3D Described earlier in the description, is a curve representing the standard variation of the polarization with the field in a ferroelectric material.

FIG. 3C shows an embodiment of the invention, in which the conductive layer 3 is insulated from the source and drain zones 5, 6. This conductive layer 3 is then connected to a specific addressing line, referred to as the write bit line (WBL). The transistor source 5 is connected to a reading line, referred to as the read bit line (RBL).

In the preferred embodiment of the invention shown in FIGS. 3A and 3B, i.e. in the embodiment where the conductive layer is electrically connected to the source 5 and drain 6 of the transistor, the pole connected to the source will be connected to a single line serving both as the addressing line and as the reading line, said line being the bit line BL and in this case the drain is connected to earth $V_{ss}$.

More specifically, FIG. 3A shows a memory point at state 0.

FIG. 3B shows a memory point according to the invention in state 1, i.e. the programmed memory point. The writing of the information in said memory point is carried out in a similar manner to that of a conventional metal-ferroelectric-semiconductor transistor, i.e. writing takes place by applying programming voltages to the gate and the conductive layer 3 respectively via the word line WL and the bit line BL. The programming voltages are such that the value of the electric field in the ferroelectric exceeds the coercive field and consequently in such a way that there is a reversal of the residual polarization in the vicinity of the drain 6. In the embodiment described, the source and drain zones are positively charged. By applying a negative voltage to BL and a positive voltage to WL, said polarization, whose direction is opposite to that of state 0 (FIG. 3A) makes it possible to repel the negative charges from the channel 8.

This polarization reversal has the effect of making the transistor non-conductive by the field effect produced, which obviously makes it necessary to appropriately choose the transistor parameters, namely the type and the doping value, the gate capacity and the gate voltage on reading. It is also necessary to choose the parameters of the ferroelectric material, namely the coercive field and the residual polarization following the polarization stage. It is this residual polarization which makes it possible to store the information in a non-volatile manner.

The programming diagram of such a memory point is given in the table of FIG. 4, in which the programming voltage Vp exceeds, in absolute terms, the coercive field and the reading voltage Vc is below said field.

According to a preferred embodiment of the invention, a dielectric layer 7 is interposed between the ferroelectric 2 and the semiconductor 1 and serves as a barrier. It is appropriately chosen in such a way that the structure is chemically stable. Thus, said dielectric layer 7 is chosen so that the two interfaces between the dielectric and the semi-conductor and between the dielectric and the ferro-electric trap a minimum of charges, so as not to shield the electric field induced by the ferroelectric 2.

According to an embodiment of the transistor of the memory cell according to the invention, consideration is given to a P type semiconductor 1 with doping of approximately $10^{15}/cm^3$. The thin ferroelectric layer 2 is of LZT, i.e. lead zirconate titanate of formula Pb(Zr,Ti)$O_3$ having an appropriate thickness.

According to the preferred embodiment of the invention, the dielectric layer 7 is of SiO$_2$ and is interposed between the ferroelectric 2 and the semiconductor 1. This dielectric layer has a thickness between a few nanometres and a few dozen nanometres. Above the dielectric layer 7 and the ferroelectric 2, a conductive material is deposited in order to form the gate electrode 4. All these layers are etched in order to obtain a transistor gate pattern. The source and drain zones 5, 6 respectively are produced in self-aligned manner, by ion implantation of donor dopants and adequate annealing.

The source and drain electrodes 5, 6 are produced on either side of the gate pattern, using a pattern base residue method. Thus, a conductive layer 3 is deposited over the entire surface and is then etched by a known etching procedure. When etching has taken place, i.e. when the planar surfaces are freed, material residues constituting the original conductive layer remain at the base of the steps, i.e. these residues form a type of hillock between the ferroelectric layer 2 and the source and drain electrodes 5, 6. Therefore these metal residues are in direct contact with the ferroelectric 2, on its vertical flank, and with the semiconductor 1 on its base, i.e. on the source and drain zones 5, 6 respectively. The metal constituting the residues is chosen in such a way that the contact with the ferroelectric 2 has an appropriate electrical behaviour. The metal thickness on the flank of the ferroelectric 2 is such that it can permit a polarization having the desired sign, which is sufficiently extensive to partly cover the channel zone. This thickness is approximately 100 nanometres for a ferroelectric layer of approximately 200 nanometres.

The process for producing such a memory point consists of producing the metal-ferroelectric-semiconductor transistor in optimized manner, so that the residual polarization and the coercive field permit an operation of the memory.

The parameters to be considered for obtaining this optimization of the transistor ferroelectric composition are firstly the threshold voltage difference VO–V1 between the two states 0 and 1. This threshold voltage difference is approximately given by the expression:

$$2e_F E(Q=0) VO-V1$$

$e_F$ being the thickness of the ferroelectric 2, VO and V1 the voltages applied to the gate corresponding to the absence of a charge (flat band voltage) in the semiconductor. This voltage difference VO–V1 must be adequate, i.e. equal to or greater than a few volts, so that for a reading gate voltage $V_L$ between VO and V1, the transconductances are significantly different and consequently permit the reading of the state of the memory point. In practice, this voltage difference VO–V1 is approximately 5 volts.

According to the preferred embodiment of the invention, a dielectric layer 7 is interposed between the ferroelectric 2 and the semiconductor 1. This dielectric layer has a typical thickness of approximately 10 to 13 nanometres. This dielectric layer makes it possible to bring the value of the electric field E (for Q=0) closer to the value EC of the coercive field.

Thus, the variation of the polarization with the electric field E is very high in a ferroelectric. For a standard ferroelectric, such as lead zirconate titanate, Pb(Zr$_{0.55}$Ti$_{0.45}$O$_3$), EC is approximately 50 kV/cm and the thickness to obtain a voltage difference of approximately 5 V (VO–V1=5 volts) is therefore $e_F$=5100 nanometers. During the programming of the erasing of the memory point, the potential difference between the drain electrode and the gate electrode (5 V) applied to said same typical thickness $e_F$, the average electric field being 100 kV/cm, so that this value is well above the value of the coercive field, whose value was given hereinbefore and which makes it possible to reverse the polarization direction and therefore the state of the memory point.

The dielectric layer makes it possible to reduce the gate capacitance $$C_i = \frac{C_F C_D}{C_F + C_D}$$

$C_F$ being the capacitance of the ferroelectric and $C_D$ the capacitance of the dielectric. The thickness of the dielectric layer is chosen in such a way as to optimize the characteristics of the transistor, i.e. its average threshold voltage $$\frac{VO + V1}{2}$$

its voltage response and its saturation current. For a dielectric thickness $e_D$ equal to or greater than 20 nanometers, the gate capacitance $C_1$ is roughly equal to the dielectric capacitance.

It is pointed out that the values given above are for exemplary purposes only, bearing in mind that the semiconductor type and its doping, the ferroelectric type and composition for changing the coercive field, the ferroelectric thickness, the electrode height on the ferroelectric flank, the dielectric thickness and the programming and reading voltages can be modified, whilst maintaining the operating principles defined hereinbefore.

The metal-ferroelectric-semiconductor transistor according to the invention has the advantage of permitting a metal contact for the polarization at the time of writing, said metal-ferroelectric contact being more intimate (absence of native oxide and better metallurgical compatibility) and therefore easier to obtain.

Moreover, the transistor according to the invention makes it possible to reduce the voltage necessary for the local switching of the ferroelectric at the time of programming, the distance between the two writing electrodes being reduced (distance between the gate and the contact on the ferroelectric).

In such a transistor, it is also possible to place a dielectric layer between the ferroelectric layer and the semiconductor channel 8 (which makes the practical construction easier), whilst still permitting a low programming voltage, because the voltage is directly applied to the ferroelectric.

We claim:

1. A non-volatile storage cell having at least one metal-ferroelectric-semiconductor transistor having a drain, a source, and a gate, said gate being insulated from said source and drain by a ferroelectric layer disposed upon a substrate, said cell comprising at least one lateral programming electrode in contact with a vertical wall of said ferroelectric layer but electrically discontinuous from said gate, and respective source and drain electrodes, said programming electrode being separate from said source and drain electrodes.

2. A cell according to claim 1, and further comprising a layer of insulating material interposed between said ferroelectric layer and said substrate.

* * * * *